(12) United States Patent
Albagli et al.

(10) Patent No.: US 11,826,710 B2
(45) Date of Patent: Nov. 28, 2023

(54) MICROPORE MEMBRANES AND METHODS OF FABRICATION THEREOF USING PILLAR TEMPLATES

(71) Applicant: Global Life Sciences Solutions USA LLC, Marlborough, MA (US)

(72) Inventors: Douglas Albagli, Marlborough, MA (US); William A Hennessy, Marlborough, MA (US)

(73) Assignee: GLOBAL LIFE SCIENCES SOLUTIONS USA, LLC, Marlborough, MA (US)

(*) Notice: Subject to any disclaimer, the term of this patent is extended or adjusted under 35 U.S.C. 154(b) by 183 days.

(21) Appl. No.: 17/219,428

(22) Filed: Mar. 31, 2021

(65) Prior Publication Data

US 2022/0314174 A1 Oct. 6, 2022

(51) Int. Cl.
*B01D 67/00* (2006.01)
*G03F 7/00* (2006.01)
*B01D 69/02* (2006.01)
*B01D 71/64* (2006.01)

(52) U.S. Cl.
CPC ......... *B01D 69/02* (2013.01); *B01D 67/0034* (2013.01); *B01D 71/64* (2013.01); *G03F 7/0015* (2013.01); *B01D 2323/24* (2013.01); *B01D 2323/42* (2013.01); *B01D 2325/021* (2013.01)

(58) Field of Classification Search
CPC ...... B01D 2325/021; B01D 2325/0214; B01D 69/02
See application file for complete search history.

(56) References Cited

U.S. PATENT DOCUMENTS

| 7,784,619 | B2 | 8/2010 | Jacobson |
| 2005/0263452 | A1 | 12/2005 | Jacobson |
| 2008/0248182 | A1 | 10/2008 | Jongsma et al. |
| 2011/0215045 | A1 | 9/2011 | Zhou et al. |
| 2012/0024775 | A1 | 2/2012 | Gong et al. |
| 2012/0114925 | A1* | 5/2012 | Harnack ............ B01D 69/144 427/535 |
| 2014/0342271 | A1 | 11/2014 | Mittelsteadt et al. |
| 2018/0071690 | A1 | 3/2018 | Coon et al. |
| 2018/0154317 | A1 | 6/2018 | Kunieda et al. |
| 2018/0296982 | A1 | 10/2018 | Li et al. |
| 2021/0299615 | A1 | 9/2021 | Shi et al. |

FOREIGN PATENT DOCUMENTS

| WO | 2019008589 A1 | 1/2019 |
| WO | 2020019406 A1 | 1/2020 |

OTHER PUBLICATIONS

Search Report received in International Application No. PCT/EP2022/058220, dated Oct. 17, 2022, 7 pages.
Written Opinion received in International Application No. PCT/EP2022/058220, dated Mar. 31, 2021, 24 pages.

* cited by examiner

*Primary Examiner* — Bradley R Spies
(74) *Attorney, Agent, or Firm* — Jeff B. Vockrodt; Culhane Meadows PLLC

(57) ABSTRACT

Porous liquid-filtering membranes having a repeatable distribution of pores of a small dimension are provided, as well as pillar templates that are used to produce such liquid filtering membranes. Also disclosed are methods of making and using the pillar templates to make porous liquid filtering membranes.

9 Claims, 13 Drawing Sheets

MICROPORE MEMBRANES AND METHODS OF FABRICATION THEREOF USING PILLAR TEMPLATES

BACKGROUND OF THE INVENTION

Porous membranes are used in various biological filtration processes. The membranes are made from a thin layer of polymeric material with holes that are formed in the material.

Photolithography has been used to make a membrane material. U.S. Pat. No. 7,784,619 to Jacobsen and assigned to Baxter International, Inc. describes a photolithographic method for making a membrane. These processes used conventional semiconductor manufacturing techniques to make membrane having a desired series of holes. The present inventors have found that standard techniques for semiconductor manufacturing are incapable of providing large surface area membranes having desirable properties.

Accordingly, the present invention seeks to improve microporous membranes and their methods of manufacture.

SUMMARY OF THE INVENTION

In one aspect, the invention involves a porous membrane (101) having a polymer layer (102) and plurality of pores (105). The polymer layer (102) defines a bottom surface of the membrane (103) and a top surface of the membrane (104). The plurality of pores (105) extend through the polymer layer (102), each pore (105) having a first region (106) with a tapered profile (107) that opens wider at the intersection of the top surface of the membrane (104) and a second region (108) with a substantially vertical profile (109) that intersects the bottom surface of the membrane (103), the first region (106) intersecting the second region (108) at an intermediate surface (110) facing exposed through the opening created by the first region (106). The substantially vertical profile may have an angle Θ in the range of 80° to 100° from the horizontal, preferably, in the range of 85° to 95° from the horizontal, and more preferably about 90° from the horizontal.

In one aspect, the intermediate surface of each pore has a surface area that varies among the pores to a greater degree than the surface are of the opening defined by the second region. One aspect of the invention is that the effective pore size is defined by the pillar template at the bottom surface of the membrane, thereby allowing greater tolerance in variability of etching through thick regions of the polymeric layer. In one aspect, the first region has a conical profile.

In one aspect, the membrane may include a pore region comprising the pores and an anti-tear ring surrounding the pore region. The polymer layer may be divided into a large number of individual membranes, each having an optional tear prevention ring surrounding their perimeter. The membrane preferably has a thickness in the range of 3 and 50 microns. The polymer layer may have a surface area of 0.1 m$^2$, or greater. It is often desirable to maximize the size of the polymer layer in order to increase the manufacturing throughput in terms of number of membranes produced per batch.

The membrane layer may comprise a material selected from at least one of polyimide, polyamide, polycarbonate, polyetherimide, polyether ketone, polyurethane, synthetic polymers, low-density polyethylene (LDPE), high-density polyethylene (HDPE), polypropylene (PP), polyvinyl chloride (PVC), polystyrene (PS), nylon, Teflon (polytetrafluoroethylene), thermoplastic polyurethanes (TPU), polyethylene, acrylate polymers, acrylate monomers, and/or acrylate elastomers.

In another aspect, the invention may involve a process of making a porous membrane. The process includes (a) depositing a polymer layer (202) on a pillar template (200), the pillar template (200) comprising a plurality of pillars (213') on a glass substrate (211) that define pores of the membrane material and an optional release layer (215); (b) depositing hard mask layer (216) over the polymer layer (202); (c) patterning the hard mask layer (216) to define a plurality of openings (205) in the hard mask layer (216) that are aligned with each pillar (213') corresponding to each pore; (d) removing the polymer layer (202) until the optional release layer (215) over each pillar (213') or the pillar (213') in the case of no release layer (215) corresponding to each pore is exposed through a first opening (206) in the polymer layer (202); (e) if the optional release layer is used, at least partially removing the release layer (215); and (f) releasing the porous membrane (201) from the pillar template (200).

In one aspect, the method may include after step (f) a second optional release layer being deposited on the pillar template and the steps (a)-(f) are repeated to form a second porous membrane. The hardmask layer and the release layer may be made from the same material, and may both be at least partially removed during step (e). In another aspect, the porous membrane in step (f) may further comprises a bottom surface of the membrane (103) and a top surface of the membrane (104); and a plurality of pores (105) extending through the polymer layer (102), each pore (105) having a first region (106) with a tapered profile (107) that opens wider at the intersection of the top surface of the membrane (104) which is formed in step (e), and a second region (108) with a substantially vertical profile (109) that intersects the bottom surface of the membrane (103) which is formed in step (f), the first region (106) intersecting the second region (108) at an intermediate surface (110) facing exposed through the opening created by the first region (106).

DETAILED DESCRIPTION OF THE INVENTION

The present invention involves production of a porous polymeric membranes using a pillar template in combination with photolithographic and etching techniques. The forming of porous regions in a polymeric membrane are described in U.S. patent application Ser. No. 16/842,402, entitled "POROUS FLAT DEFORMATION-RESISTANT MEMBRANE" which was filed Apr. 7, 2020, and Ser. No. 16/842,448, entitled "BIOCOMPATIBLE HIGH ASPECT-RATIO POROUS MEMBRANE" which was filed Apr. 7, 2020, each of which is incorporated by reference herein. The techniques for making a porous polymeric membrane using techniques adapted from semiconductor manufacturing technology are described in these applications.

One difficulty faced in the production of smaller pore size (<3.0 micron vias) polymeric membranes using these techniques is achieving uniform-size pores due to lack of uniformity in etching through relatively thicker polymeric membrane layers. In one aspect of the present invention, the total polymer etch time can be reduced by shortening the length of polymer which needs to be etched through by using a pillar template. In the case of a 10 micron polymer layer, the present invention can speed up the etch time by 1.25× by reducing the etch from 10 microns to 8 microns. In another aspect, the present invention can provide a more controllable exit hole geometry by using a re-usable pillar template that can be separately produced and subjected to independent quality control, while insulating the larger aspect ratio via etch from determining the exit hole geometry of the porous membrane.

Figure 1A:
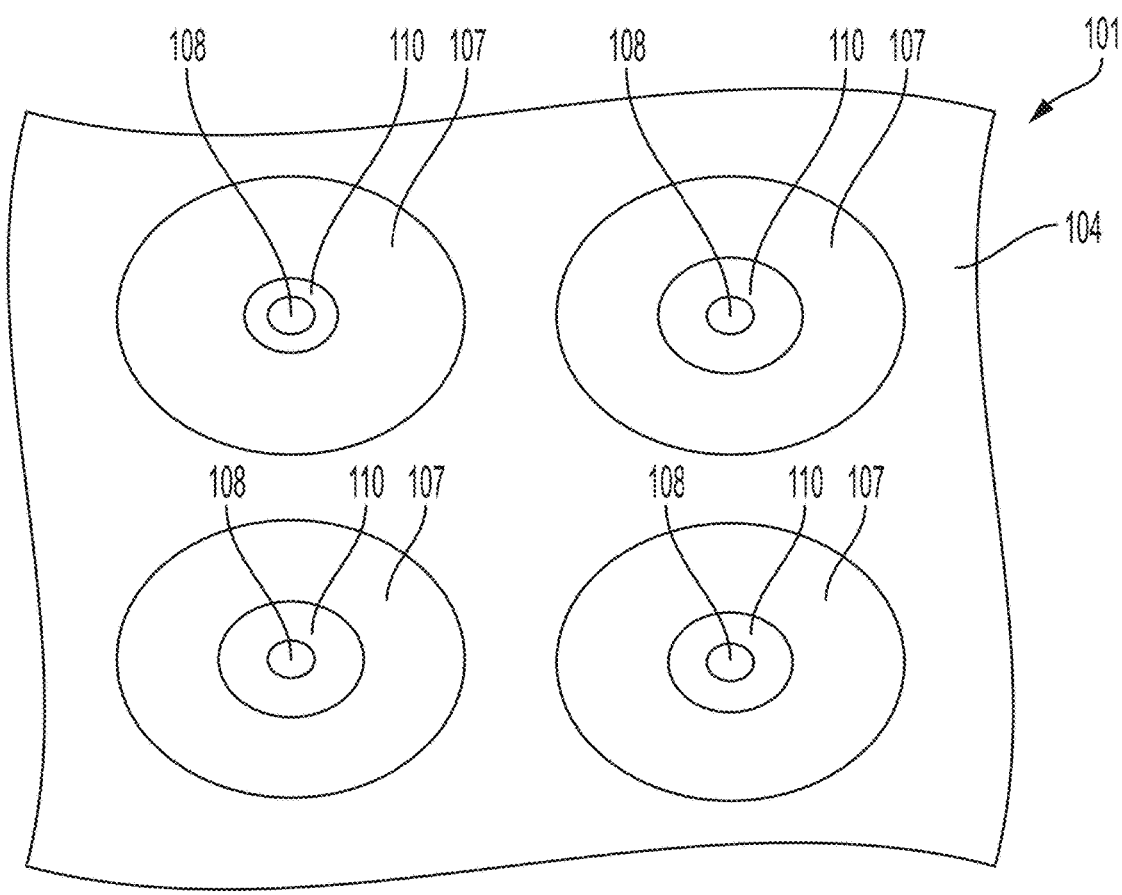
FIG. 1A shows a top-down close-up view of the pores of a porous membrane according to an embodiment of the invention.
Figure 1B:
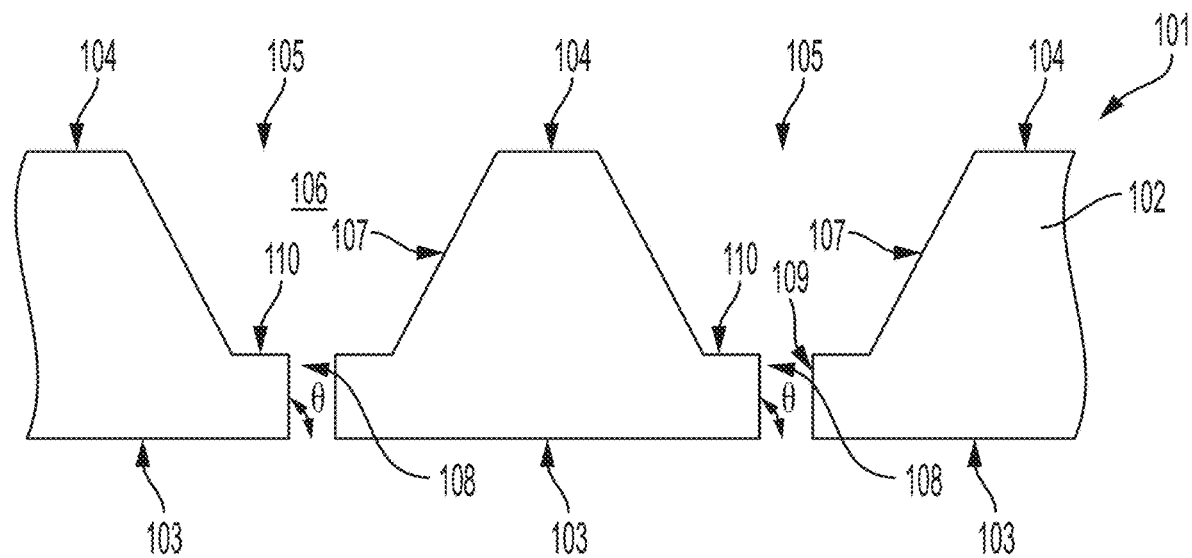
FIG. 1B shows a side close-up view of the pores of a porous membrane according to an embodiment of the invention.

A porous membrane 101 according to an embodiment of the invention is shown in FIGS. 1A-1B, which shows close-up top down and side views of a section of a porous membrane 101. The porous membrane 101 is preferably made from a polyimide material and behaves as a unitary membrane layer. The porous membrane 101 is produced using a pillar template according to an aspect of the invention further described below. The pillar templates described herein allow for formation of a well-defined and reproducible exit dimension defined by the second region 108 when used in conjunction with photolithographic techniques performed on the polymeric layer 102 of the porous membrane 101. The effective pore size for a membrane is determined by the exit dimension 108. As explained further below, the pillar template provides a way to overcome difficulties encountered in etching pores in polymeric materials due to non-uniformity encountered when etching high aspect ratio vias in polymeric materials. Once produced, the pillar template may be reused several times after applying a fresh release layer.

The polymer layer 102 of the membrane 101 has a bottom surface 103 and top surface 104. The plurality of pores 105 extend through the polymer layer 102. Each pore has a first region 106 with a tapered profile 107 that opens wider at the intersection of the top surface of the membrane 104, and a second region 108 with a substantially vertical profile 109 that intersects the bottom surface of the membrane 103. As shown in FIG. 1, the tapered profile 107 may be a conical profile. The first region 106 intersects the second region 108 at an intermediate surface 110 exposed through the opening created by the first region 106. The intermediate surface 110 provides a buffer that allows for non-uniformity in the etching and formation of the first region among different pores in the same membrane, and between separate manufacturing runs of different membranes.

Figure 2A:
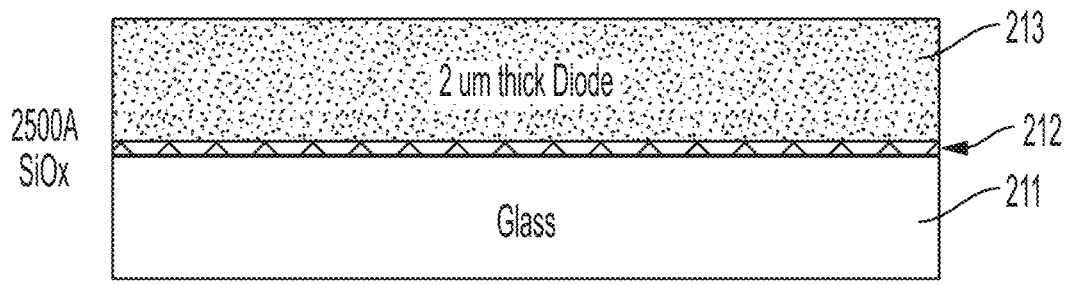
FIGS. 2A-2F show the manufacture of a porous membrane according to an embodiment of the invention.
Figure 2B:
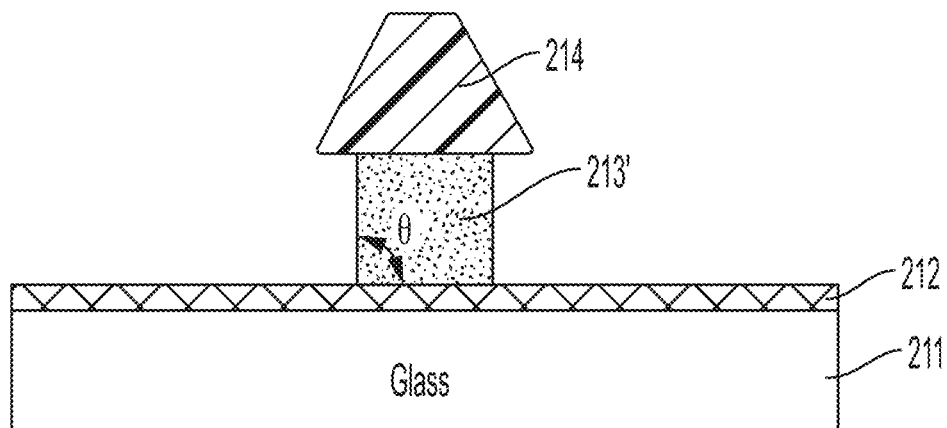
Figure 2C:
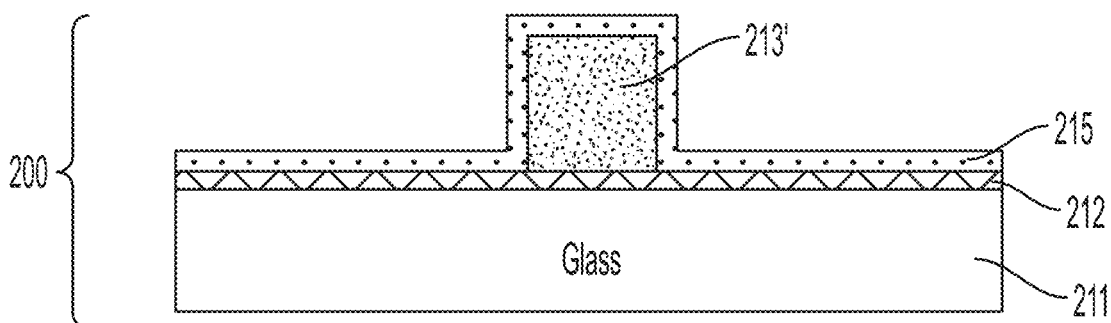
Figure 2D:
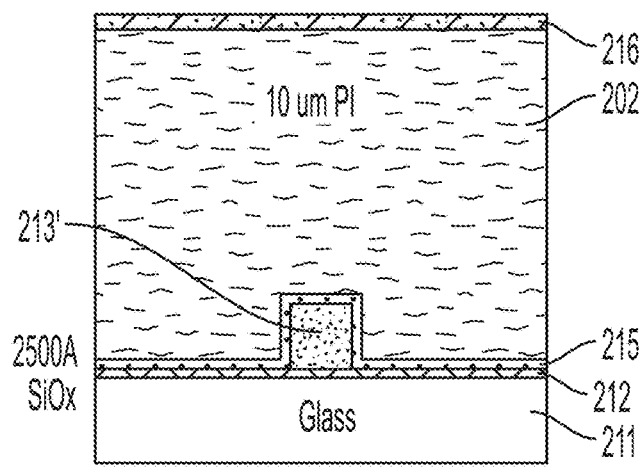
Figure 2E:
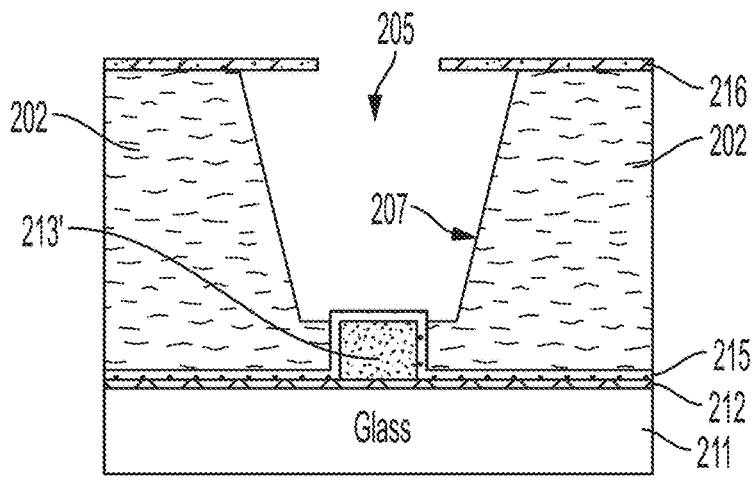
Figure 2F:
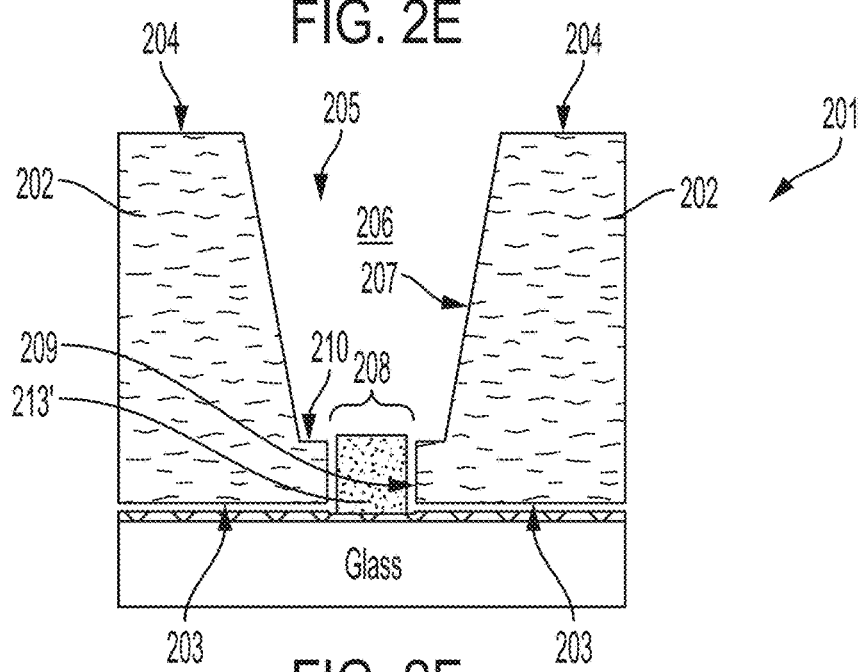

The substantially vertical profile of the second region 108/208 is defined by the substantially vertical profile of each of the pillars on the pillar template 200, shown in FIG. 2B and FIG. 2F. Preferably, the substantially vertical profile of the second region 108 has an angle $\Theta$ as shown in FIG. 1B in the range of 80° to 100° relative to the horizontal, more preferably in the range of 85° to 95° relative to the horizontal, and most preferably about 90°. This angle is complementary to the sidewall of each pillar in the pillar template as shown in FIG. 2B. When, during operation, the flow is directed toward the bottom surface of the membrane 103, it is desirable that the opening forming the second region 108 is the smallest at the edge intersecting the bottom surface 103. In other words, the angle $\Theta$ is greater than 90° so that the opening becomes wider as fluid flows into the membrane. This can prevent or reduce clogging of the membrane by preventing particles and/or material from entering the pores that may clog the pores. In some cases, an angle $\Theta$ greater than 90° can make separation of the membrane from the pillar template difficult due to formation of a structure similar to dovetail joint between the membrane and pillars of the pillar template that can work to hold the membrane in place. The difficulty in removing the membrane from the pillar template may be mitigated in some cases by using a release layer that once removed provides clearance for the membrane opening 108 to be separated from the pillar. In other cases, a release layer to facilitate the desired angle may not be necessary where the dimensions and material properties are such that the membrane may be removed from the pillar template.

The pillar template may be made from glass, for example. Other suitable materials include silicon or metal. The porous membrane 101 is made from a polymer layer 102. In one preferred aspect of the invention, the membrane layer 102 and pillar template have a similar coefficient of thermal expansion. One desirable material is polyimide. There are many grades of polyimide with different CTE values. In one aspect, a polyimide is used that has a CTE similar to that of glass. The polyimide may be applied to and cured on a substrate where the CTE of the cured polyimide substrate matches that of the glass. In one embodiment, the polyimide has a CTE of 3 ppm/° C. between 50° C. and 200° C. at a 20 micron thickness, and the glass has a CTE of 3.2 ppm/° C. between 50° C. and 200° C. As noted above the CTE of the polymer and base layer should be within a range of ±25% of each other, more preferably ±15% of each other, and most preferably within ±10%. For example, as noted above the CTE of glass is about 7% higher than that of the polyimide layer.

Suitable materials for the membrane layer 102 may include polyimide, polyamide, polycarbonate, polyetherimide, polyether ketone, polyurethane, synthetic polymers, low-density polyethylene (LDPE), high-density polyethylene (HDPE), polypropylene (PP), polyvinyl chloride (PVC), polystyrene (PS), nylon, Teflon (polytetrafluoroethylene), thermoplastic polyurethanes (TPU), polyethylene, acrylate polymers, acrylate monomers, or acrylate elastomers. The membrane layer 102 may be coated onto the pillar template using spin coating, spray coating, meniscus coating, slot die coating, dip coating, extrusion coating, lamination (with adhesive attachment to substrate). The membrane layer 102 may be cured using thermal curing, UV curing, or a combination of both.

The pores may be uniformly distributed across the entire area of the membrane depending on the geometry of the pillar template. Alternatively, the pillars may be arranged to provide a gradient of pores over the membrane surface. The porous membrane may have a thickness in a range of 3 and 50 microns, preferably in a range of 5 and 15 microns, most preferably about 10 microns. The present invention may be used to provide large area porous membranes, including those having a surface area exceeding 0.1 m$^2$. Much larger substrates and membrane layers may be made as desired as further described herein. The pillar template may include several individual membranes that are cut from a single material layer as shown in FIG. 1D.

Figure 1C:
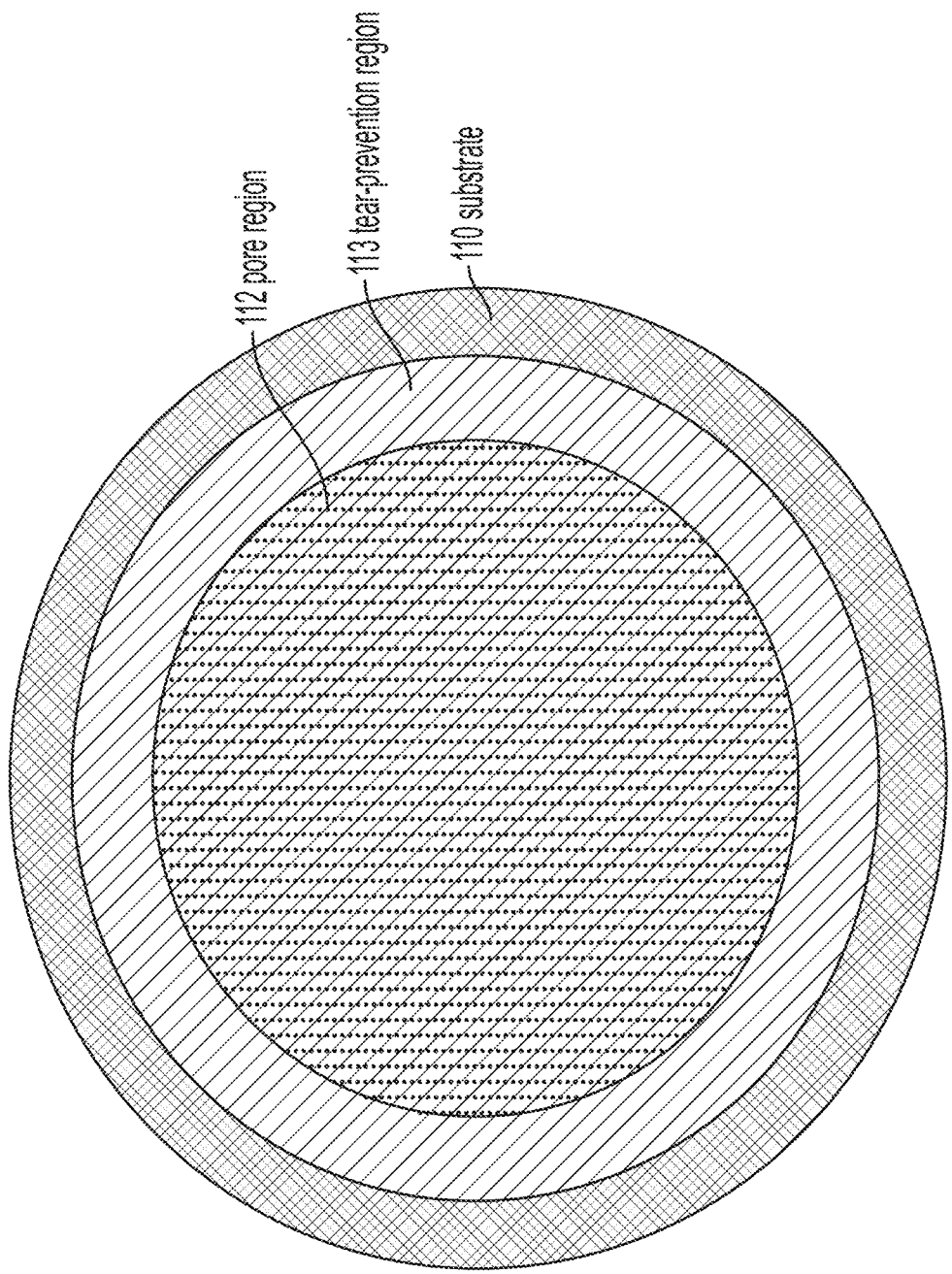
FIG. 1C shows a top view of a porous membrane having a tear prevention ring according to an embodiment of the invention.
Figure 1D:
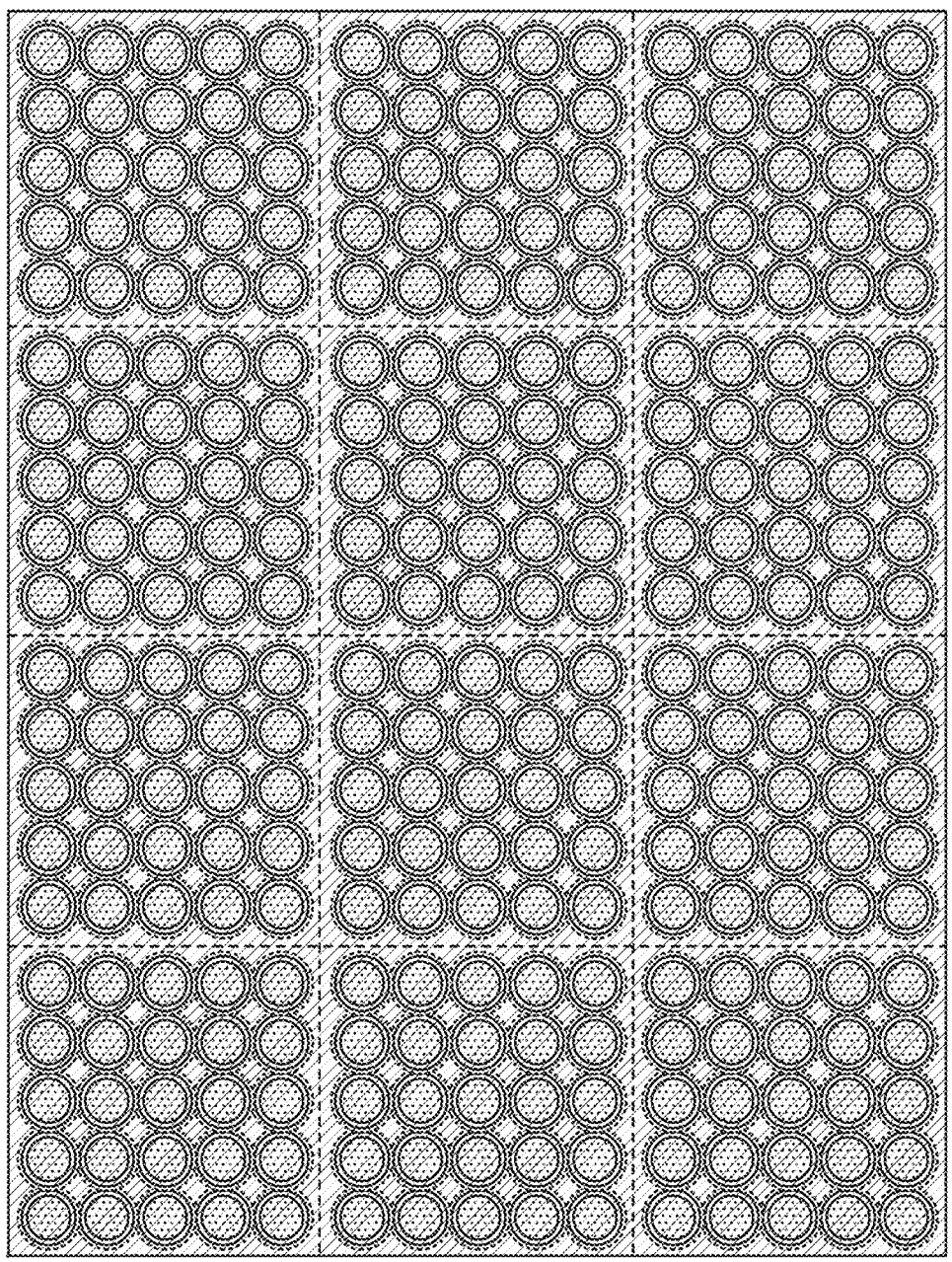
FIG. 1D shows a top view of several porous membranes made using a single pillar template according to an embodiment of the invention.

FIG. 1C shows an exemplary porous membrane on a pillar template 110 where a circular pore region 112 is surrounded by a tear prevention ring 113. The concept of a tear prevention ring is disclosed in the U.S. patent application Ser. No. 17/115,054, entitled "MEMBRANE TEAR PREVENTION RING" which was filed Dec. 7, 2020, the disclosure of which is incorporated herein by reference. Both the pore region 112 and tear prevention ring 113 are made from polymer layer 102. The tear prevention ring 113 is region of no pores within the polymer layer that provides strength to the membrane and prevents tearing during delamination from the pillar template 110 and during use. A circular pattern is etched in the porous membrane 102 to separate each individual membrane filter from the polymer layer exposing the underlying pillar template. As will be understood from the disclosure below, the pillar template may have a circular pillar pattern surrounding the pillars corresponding to the pore region 112, the circular pillar pattern corresponding cutout circle surrounding the membrane so that the polymer etch used to create the first region 106 also separates adjacent membranes from each other. FIG. 1D shows several membranes being formed on a single pillar template.

Making Porous Membrane 201 from Pillar Template 200

In one embodiment, the invention involves making a porous membrane 201 from a pillar template 200 as shown in FIG. 2C. The pillar template includes a glass substrate 211 with an adhesion layer 212 of silicon dioxide (e.g., 2500 angstroms) blanket deposited over the glass substrate 211, and a pillar 213' of amorphous silicon (e.g., 2 microns thick). Before being used or re-used, the pillar template 200 may be coated with an optional release layer 215, which can be for example 1400 angstroms of blanket deposited indium tin oxide (ITO). The pillar template 200 includes pillars that have been patterned onto the glass substrate that serve to define the exit holes 208 of a porous membrane 201. The pillar template therefore includes a distribution of pillars 213', that may have for example a circular shape, and include a diameter that taken with the release layer 215 define the geometry of the second region 208 defining the exit hole geometry for each pore of the porous membrane 201.

As shown in FIG. 2C, the pillar template 200 is made by first blanket depositing an adhesion layer 212 of silicon dioxide over a glass substrate 211. The pillar material layer of silicon 213, e.g. 2 micron thick i-Si or amorphous silicon, is then deposited over the adhesion layer 212 and substrate 211, as shown in FIG. 2A. Although not shown, a hardmask (e.g., SiN or ITO) may be deposited on the silicon layer. Photoresist is deposited and patterned to form a photoresist pattern 214' that defines the pillars 213' in the pillar material layer 213. The pillar material layer 213 is etched down to the adhesion layer 212 to define the plurality of pillars 213'(e.g., 2.5 micron diameter), wherein the pillars have a substantially vertical profile.

The conditions for etching the pillars 213' to leave a nearly vertical sidewall profile must be controlled. FIG. 2B shows the substantially vertical profile of pillars 213' has an angle Θ in the range of 80° to 100° relative to the horizontal, more preferably in the range of 85° to 95° relative to the horizontal, and most preferably about 90°. The angle is complementary to that of the substantially vertical profile of the second region 108.

Figure 3:
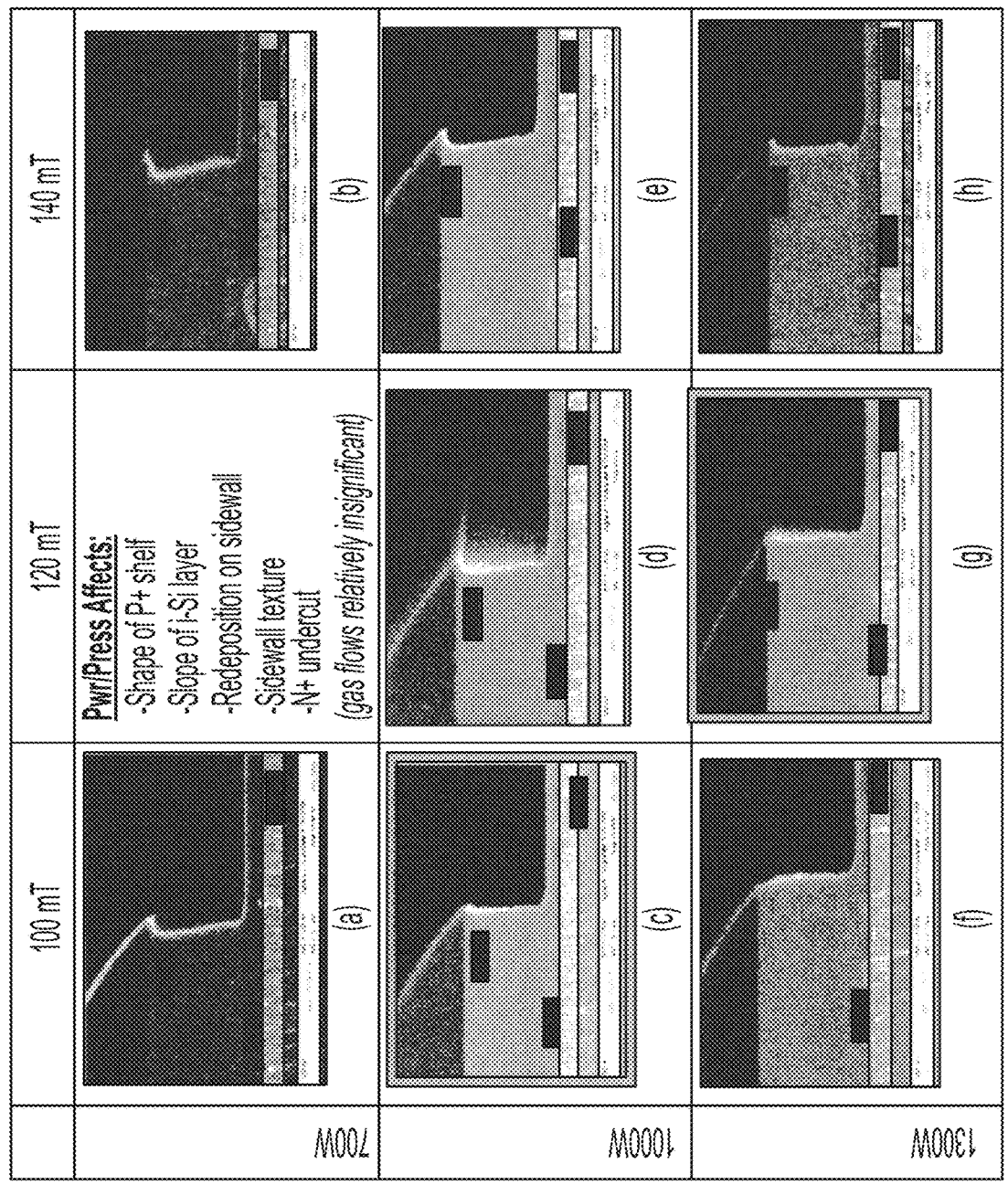
FIG. 3 shows the relationship of pressure (mT) and power (W) influences sidewall geometry in the formation of pillars of the pillar membranes described herein.

FIG. 3 shows how plasma etching power and pressure can be controlled to create a desired sidewall profile. As noted above, the pillar should be nearly vertical with slightly concave shape to facilitate removal of the finished porous membrane from the pillar template. As shown in FIG. 3, for the i-Si layer the best results were obtained at 1000 W and 100 mT and 1300 W and 120 mT. The slope should range from 80° to 100° relative to the horizontal, preferably from 85° to 95° relative to the horizontal, and most preferably 90°. The pillar profile may be additionally controlled by varying parameters of the silicon deposition. For example, the pillar material may be deposited in a way that results in a differential etching rate through the thickness of the silicon layer. For example, a step function of deposition variables may be used to create six distinct layers of silicon having variable etch rate from the top to the bottom. This could include a material with the fastest etch rate on the bottom, slightly slower etch rate toward the top layers. In addition, the topmost layer could be deposited to have an etch rate that is slightly higher than the previous layer in order to reduce overhang. This technique may also be used to produce a differential etch rate through the thickness of a silicon nitride pillar material, as described in embodiments disclosed herein.

The pillar template 200 can then be used to make a porous membrane 201 using a pillar template as shown in FIGS. 2D-2F. An optional release layer 215 is blanket deposited over the pillars 213' and substrate 211. A polymer layer 202 (e.g., 10 microns of polyimide) is first deposited on the pillar template 200, the pillar template 200 comprising a plurality of pillars 213' that define pores of the membrane material. The polymer layer 202 may be coated onto the pillar template using a coating process.

A hard mask layer 216 (e.g., 3500 angstroms silicon nitride) is deposited over the polymer layer 202 as shown in FIG. 2D. Photoresist (not shown) is deposited over the hardmask layer 216 and patterned, and the hardmask layer 216 is etched through the patterned photoresist to provide opening 205. The photoresist (not shown) is then stripped. The polymer layer 202 is etched (approximately 8 microns deep) through the patterned hardmask layer 216 until the optional release layer 215 in the region over the pillars 213' is exposed through the opening 206 as shown in FIG. 2E. In the case of no release layer 215, the etch is conducted until the top of the pillars 213' are exposed through the opening 206.

The hardmask layer 216 is then removed using wet etching. The release layer 215, if used, on the pillar template 200 is then at least partially removed using wet etching as shown in FIG. 2F. The porous membrane 201 can then be removed from the pillar template 200. The pillar template can then be reused to make another porous membrane, after having another release layer 216 deposited on the pillar template.

The porous membrane 201 according to this embodiment includes a polymer layer 202 having a bottom surface 203 and top surface 204. The plurality of pores 205 extend through the polymer layer 202. Each pore has a first region 206 with a tapered profile 207 that opens wider at the intersection of the top surface of the membrane 204, and a second region 208 with a substantially vertical profile 209 that intersects the bottom surface of the membrane 203. As shown in FIG. 2F, the tapered profile 207 may be a conical profile. The first region 206 intersects the second region 208 at an intermediate surface 210 exposed through the opening created by the first region 206. The intermediate surface 210 provides a buffer that allows for non-uniformity in the etching and formation of the first region among different pores in the same membrane, and between separate manufacturing runs of different membranes.

Making Porous Membrane 401 from Pillar Template 400

Figure 4A:
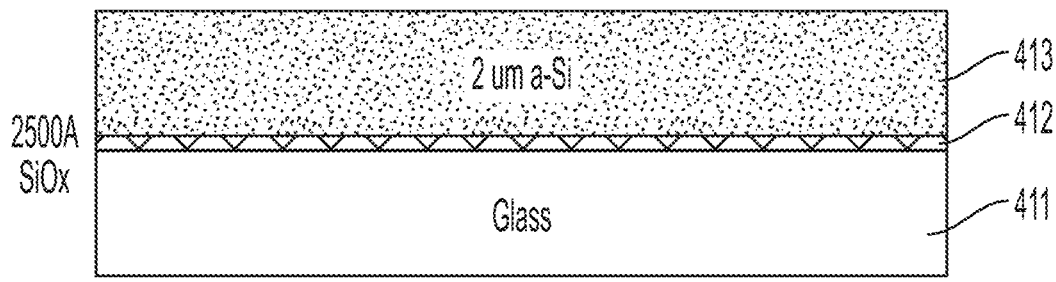
FIGS. 4A-4E show the manufacture of a porous membrane according to an embodiment of the invention.
Figure 4B:
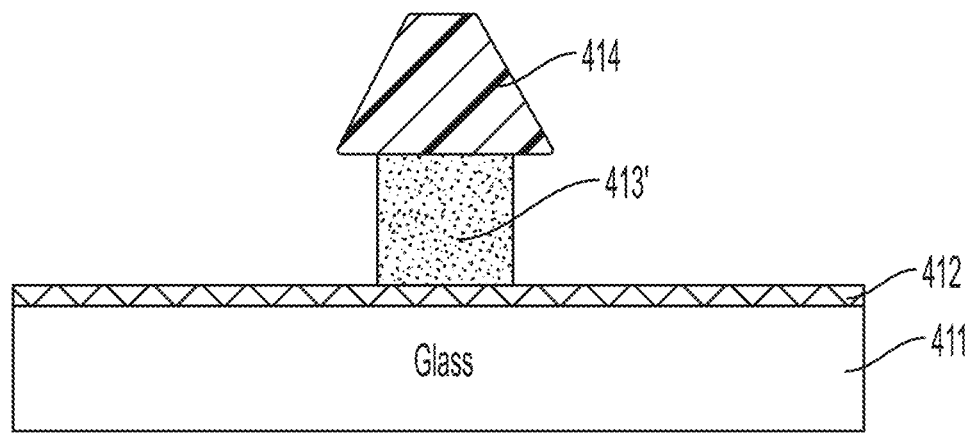
Figure 4C:
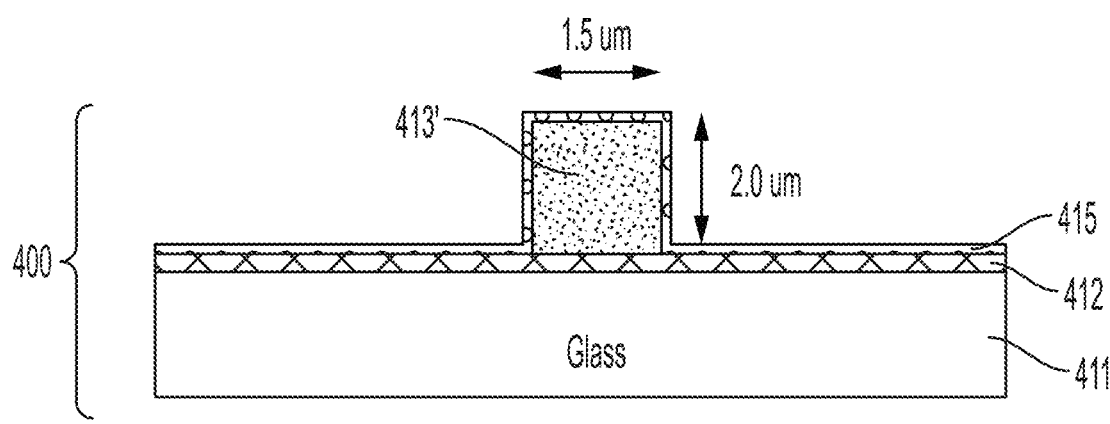

In one embodiment, the invention involves making a porous membrane 401 from a pillar template 400 as shown in FIG. 4C. The process of making the pillar template 400 of FIG. 4C involves depositing an adhesion layer 412 (e.g., 2500 silicon dioxide) over a glass substrate 411. Pillar material layer 413 (e.g., 2 micron amorphous silicon) is deposited over the adhesion layer 412 and substrate 411. Although not shown, a hardmask (e.g., SiN or ITO) may be deposited on the silicon layer. Photoresist 414 is deposited (2 microns) and patterned to define 2.0 micron diameter circles for defining pillars 413'. The pillar material layer 413 is dry etched using an anisotropic etch to make a vertical pillar 413' of 1.5 micron diameter (~0.25 micron side undercut). The dry etch is conducted until the adhesion layer 412 is exposed. A protection layer 415 (<1000 angstroms a-Si) is deposited over the patterned pillar material 413' and adhesion layer 412.

Figure 4D:
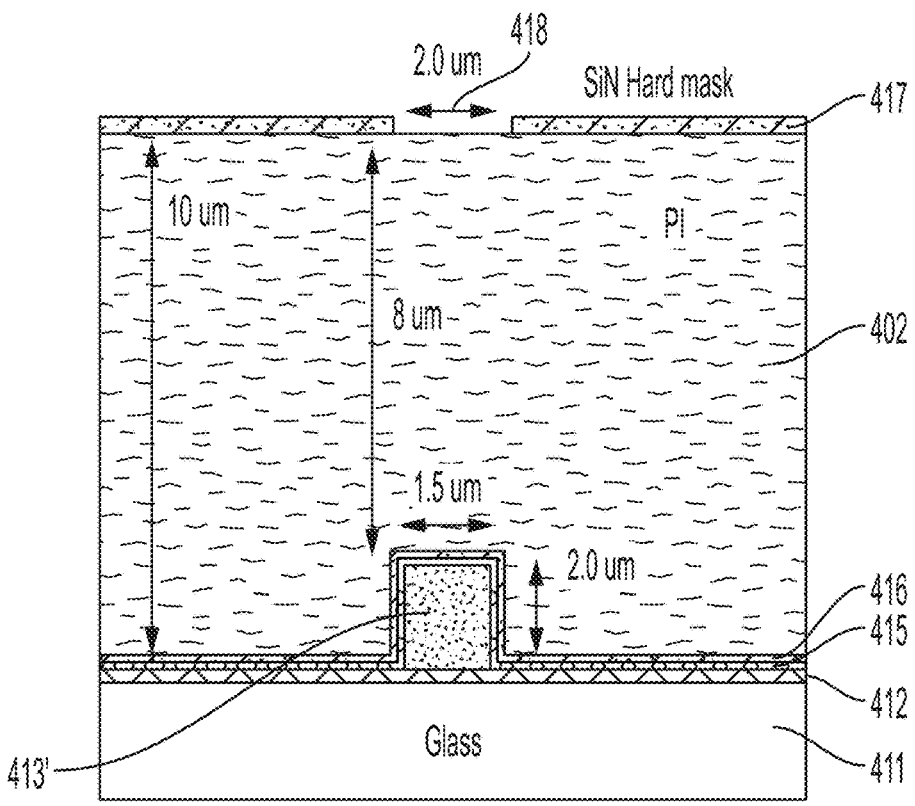
Figure 4E:
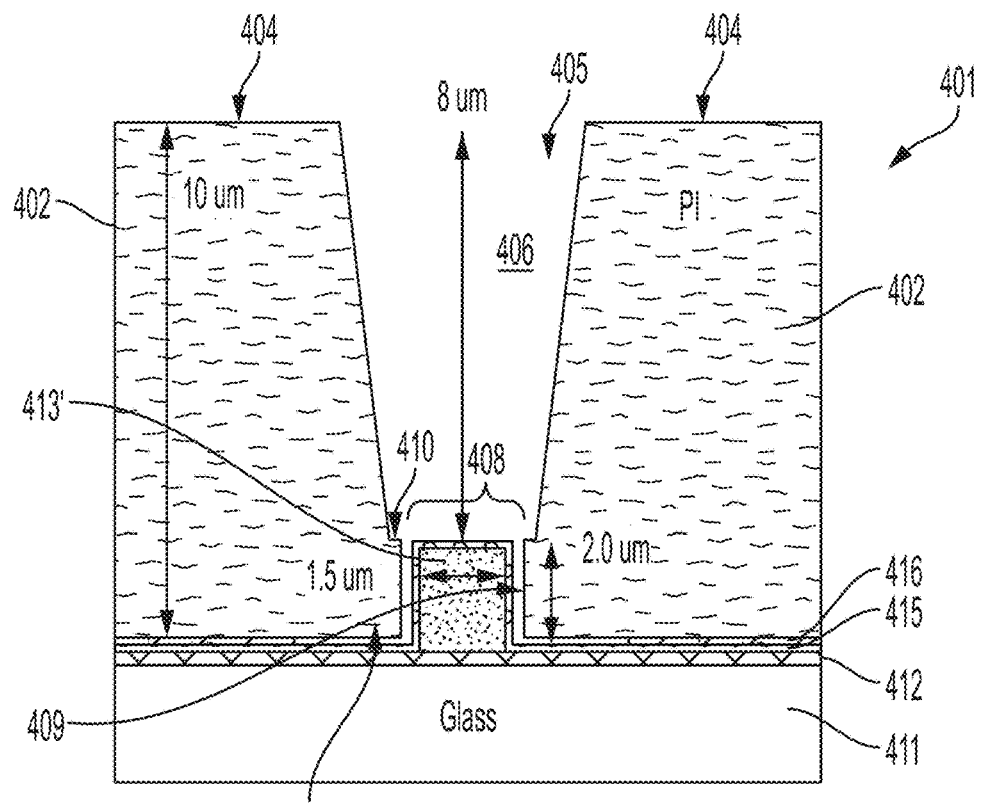

The pillar template 400 can then be used to make a porous membrane 401 using a pillar template as shown in FIGS. 4D-4E. The pillar template 400 comprises a plurality of pillars 413' that define pores of the membrane material and a protection layer 415 deposited over the pillars 413' and an adhesion layer 412 as shown in FIG. 4C. An optional release layer 416 (1000 angstroms ITO or SiN) is deposited over the protection layer 415. Next a polymer 402 (e.g., 10 microns of polyimide) is deposited over the optional release layer 416 on the pillar template 400.

A hard mask layer 417 (e.g., 2.0 microns silicon nitride) is deposited over the polymer layer 402 as shown in FIG. 4D. Photoresist (not shown) is deposited over the hardmask layer 417 and patterned, and the hardmask layer 417 is etched through the patterned photoresist to provide opening 418. The photoresist (not shown) is then stripped. The polymer layer 402 is etched (approximately 8 microns deep) through the patterned hardmask layer 417 until the release layer 416 in the region over the pillars 413' is exposed through the opening 406 as shown in FIG. 4E. In the case of no release layer 416, the polymer layer 402 is etched until the top of the pillars 413' is exposed through the opening 406.

The hardmask layer 417 is then removed using wet etching. If the release layer 416 is made from SiN, the step of removing the hardmask layer 417 will also remove the release layer. Otherwise, in the case the release layer is another material such as ITO, it is at least partially removed using wet etching. The structure with at least partially removed release layer 416 is shown in FIG. 4E. It may be desirable to adjust the amount of wet over-etch to release from pillar but not completely delaminate during etch, so that the membrane can be removed in a controllable way during a subsequent delamination step. The porous membrane 401 is thereafter released from the pillar template 400. The pillar template can then be reused to make another porous membrane.

The porous membrane 401 according to this embodiment includes a polymer layer 402 having a bottom surface 403 and top surface 404. The plurality of pores 405 extend through the polymer layer 402. Each pore has a first region 406 with a tapered profile 407 that opens wider at the intersection of the top surface of the membrane 404, and a second region 408 with a substantially vertical profile 409 that intersects the bottom surface of the membrane 403. As shown in FIG. 4E, the tapered profile 407 may be a conical profile. The first region 406 intersects the second region 408 at an intermediate surface 410 exposed through the opening created by the first region 406. The intermediate surface 410 provides a buffer that allows for non-uniformity in the etching and formation of the first region among different pores in the same membrane, and between separate manufacturing runs of different membranes.

Making Porous Membrane 501 Using Pillar Template 500

Figure 5A:
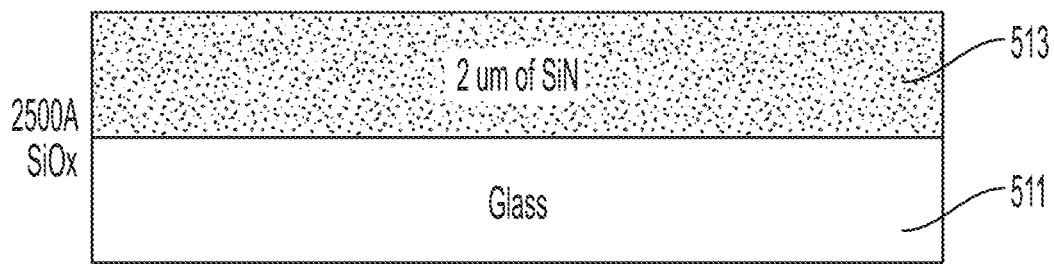
FIGS. 5A-5E show the manufacture of a porous membrane according to an embodiment of the invention.
Figure 5B:
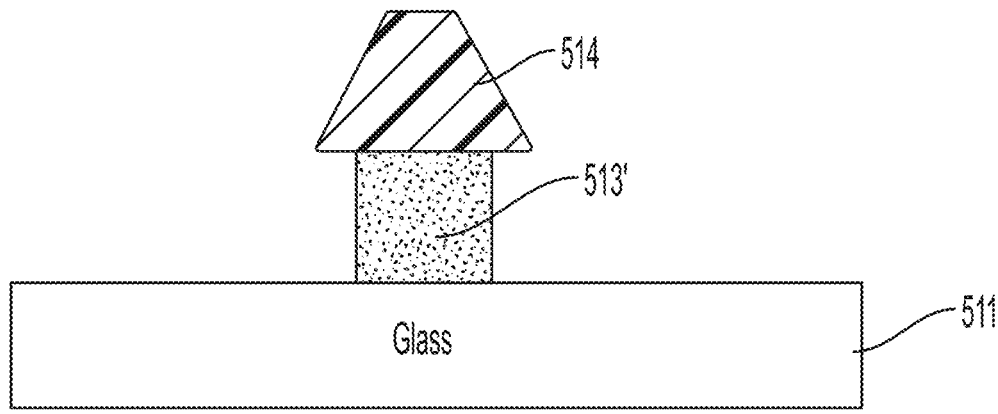
Figure 5C:
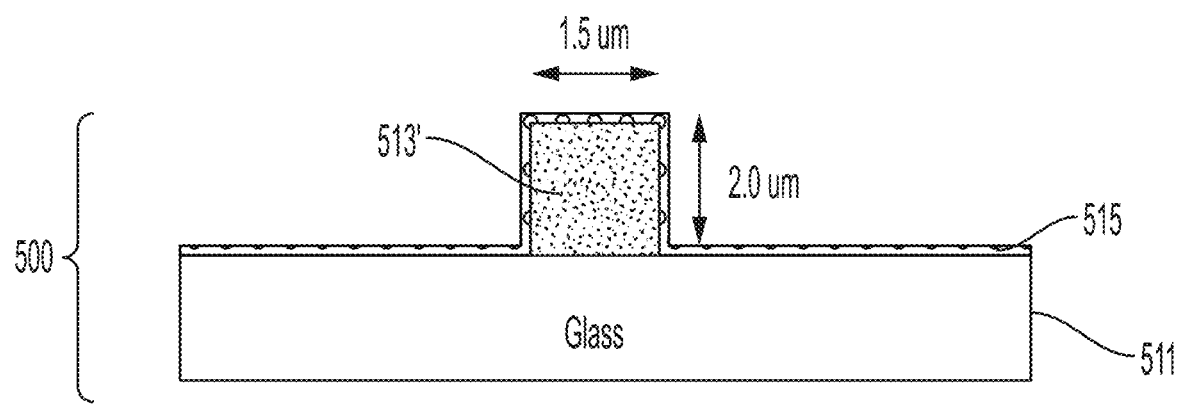

In one embodiment, the invention involves making porous membrane 500 from a pillar template 500 as shown in FIG. 5C. The process of making the pillar template 500 involves depositing a pillar material layer 513 (e.g., 2.0 micron silicon nitride) over a glass substrate 511. Although not shown, a hardmask (e.g., PECVD oxide) may be deposited on the silicon layer. The pillar profile may be controlled by varying parameters of the silicon nitride deposition. For example, the pillar material may be deposited in a way that results in a differential etching rate through the thickness of the silicon nitride layer. For example, a step function of deposition variables may be used to create six distinct layers of silicon nitride having variable etch rate from the top to the bottom. This could include a material with the fastest etch rate on the bottom, slightly slower etch rate toward the top layers. In addition, the topmost layer could be deposited to have an etch rate that is slightly higher than the previous layer in order to reduce overhang.

Photoresist 514 is deposited (2 microns) and patterned to define 2.0 micron diameter circles. The pillar material layer 513 is dry etched using an anisotropic etch to make a vertical pillar 513' of 1.5 micron diameter (~0.25 micron side undercut). The dry etch is conducted until the glass substrate 511 is exposed. A protection layer 515 (<1000 angstroms a-Si) is deposited over the patterned pillar material 513' and adhesion glass substrate 511.

Figure 5D:
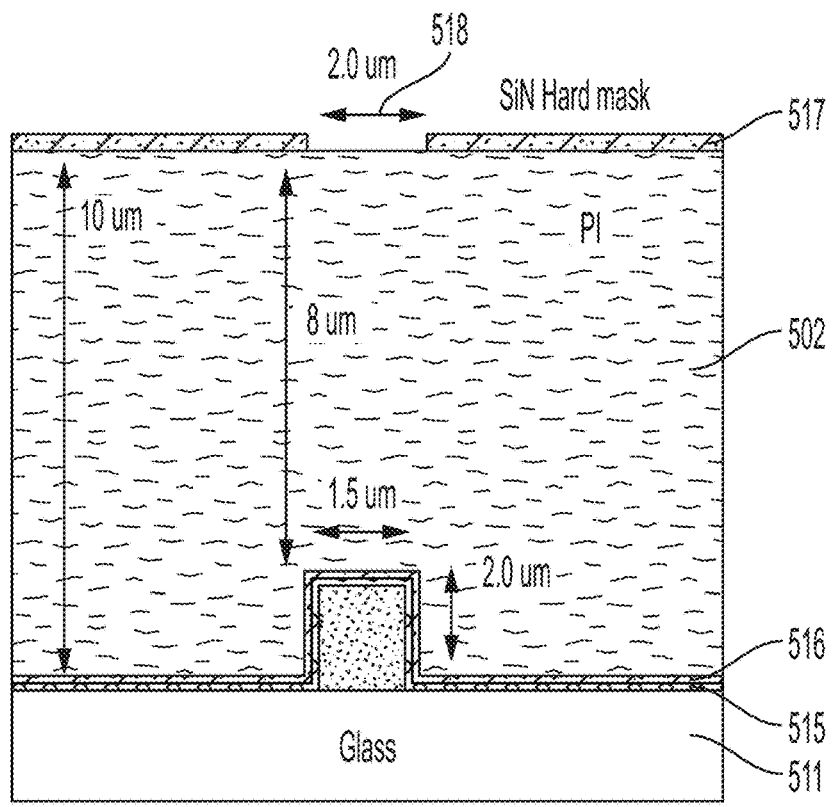
Figure 5E:
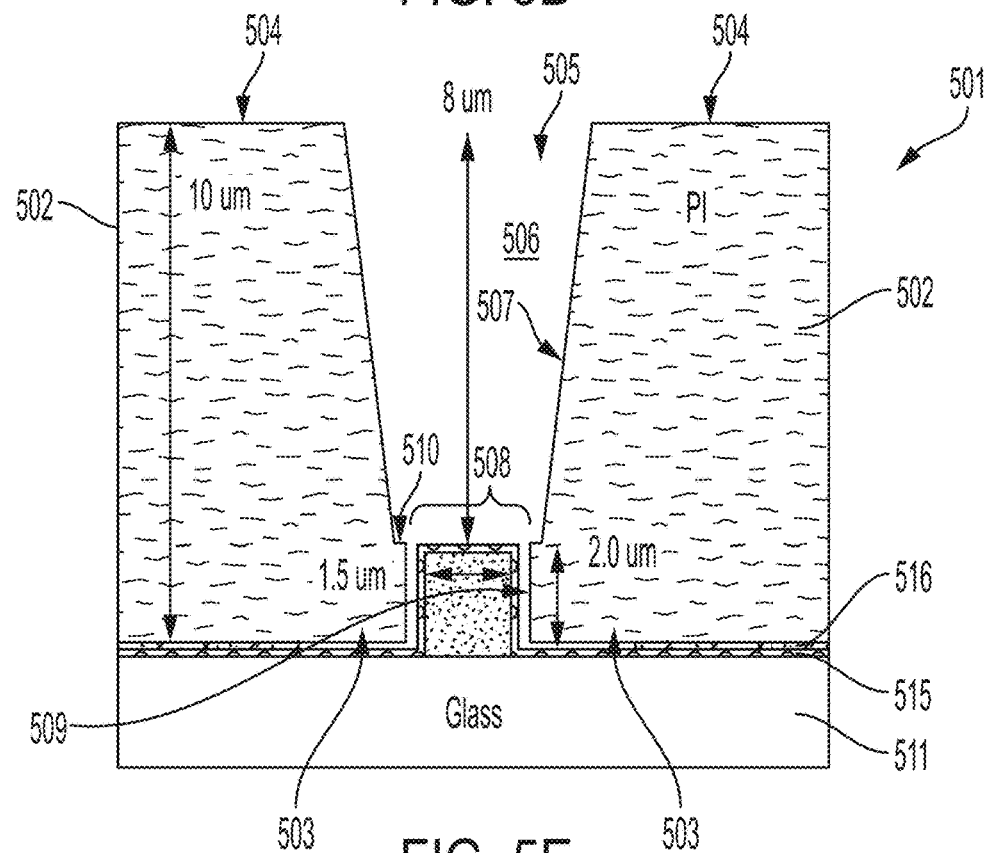

In one embodiment, the invention involves a process of making a porous membrane 501 using a pillar template as shown in FIGS. 5D-5E. The pillar template 500 comprises a plurality of pillars 513' that define pores of the membrane material and a protection layer 515 deposited over the pillars 513' and the glass substrate 511 as shown in FIG. 5C. An optional release layer 516 (1000 angstroms ITO or SiN) is deposited over the protection layer 515. Next a polymer 502 (e.g., 10 microns of polyimide) is deposited over the optional release layer 516 on the pillar template 500.

A hard mask layer 517 (e.g., 3000 angstroms silicon nitride) is deposited over the polymer layer 502 as shown in FIG. 5D. Photoresist (not shown) is deposited over the hardmask layer 517 and patterned, and the hardmask layer 517 is etched through the patterned photoresist to provide opening 518. The photoresist (not shown) is then stripped. The polymer layer 502 is etched (approximately 8 microns deep) through the patterned hardmask layer 517 until the release layer 516 in the region over the pillars 513' is exposed through the opening 506 as shown in FIG. 5E. In the case of no release layer 516, the polymer layer 502 is etched until the top of the pillars 513' is exposed through the opening 506.

The hardmask layer 417 is then removed using wet etching. If the release layer 516 is made from SiN, the step of removing the hardmask layer 517 will also remove the release layer. Otherwise, in the case the release layer is another material such as ITO, it is at least partially removed using wet etching. The structure with at least partially removed release layer 516 is shown in FIG. 5E. It may be desirable to adjust the amount of wet over-etch to release from pillar but not completely delaminate during etch, so that the membrane can be removed in a controllable way during a subsequent delamination step. The porous membrane 501 is thereafter released from the pillar template 500. The pillar template can then be reused to make another porous membrane.

The porous membrane 501 according to this embodiment includes a polymer layer 502 having a bottom surface 503 and top surface 504. The plurality of pores 505 extend through the polymer layer 502. Each pore has a first region 506 with a tapered profile 507 that opens wider at the intersection of the top surface of the membrane 504, and a second region 508 with a substantially vertical profile 509 that intersects the bottom surface of the membrane 503. As shown in FIG. 5E, the tapered profile 507 may be a conical profile. The first region 506 intersects the second region 508 at an intermediate surface 510 exposed through the opening created by the first region 506. The intermediate surface 510 provides a buffer that allows for non-uniformity in the etching and formation of the first region among different pores in the same membrane, and between separate manufacturing runs of different membranes.

Making Porous Membrane 601 Using Pillar Template 600

Figure 6A:
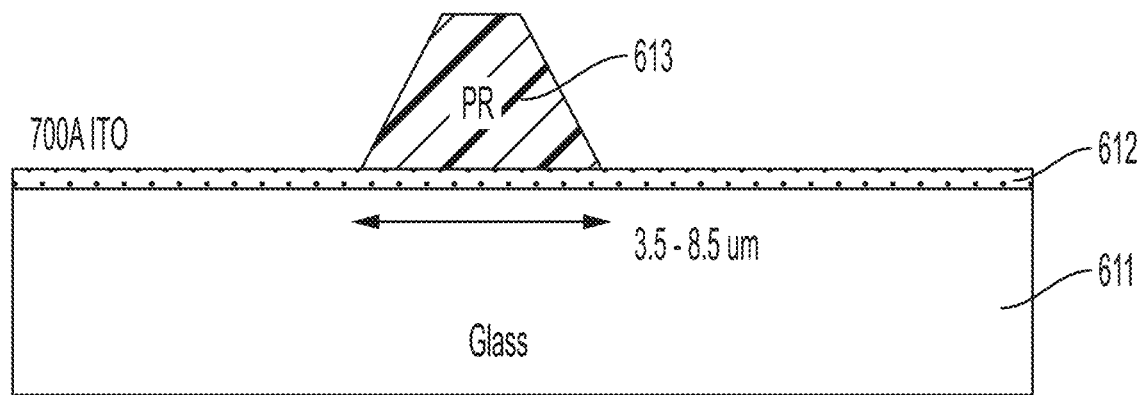
FIGS. 6A-6F show the manufacture of a porous membrane according to an embodiment of the invention.
Figure 6B:
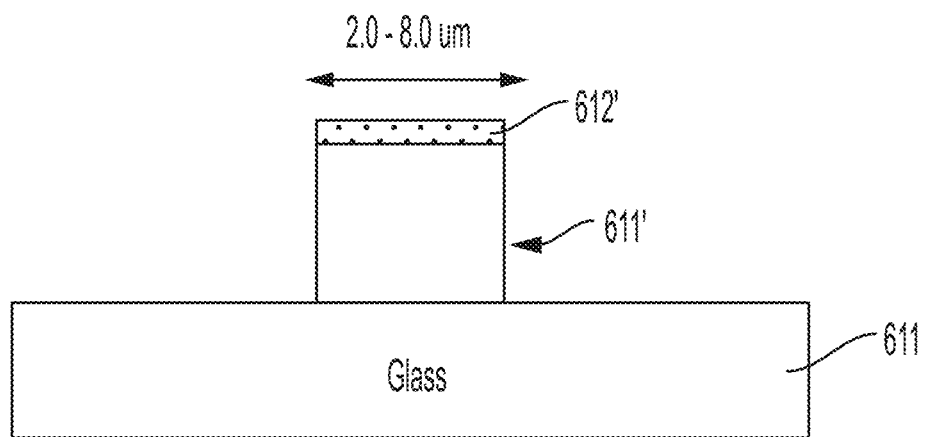
Figure 6C:
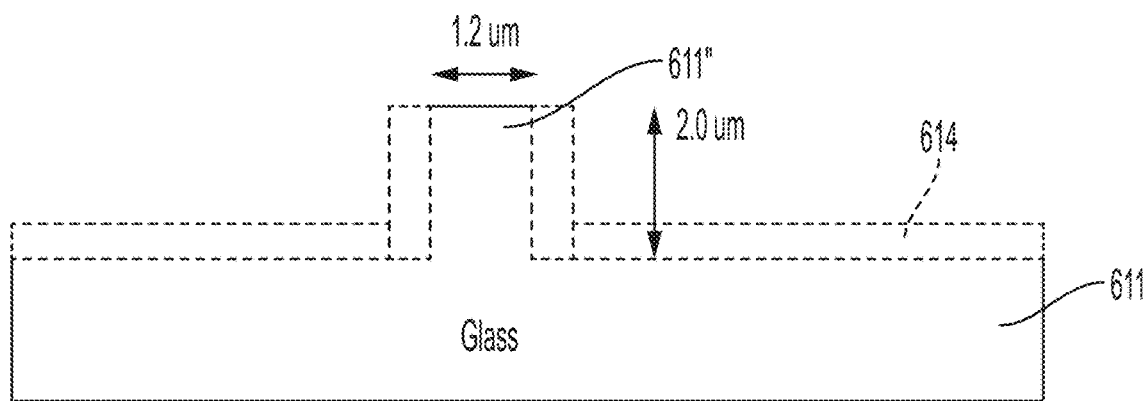
Figure 6D:
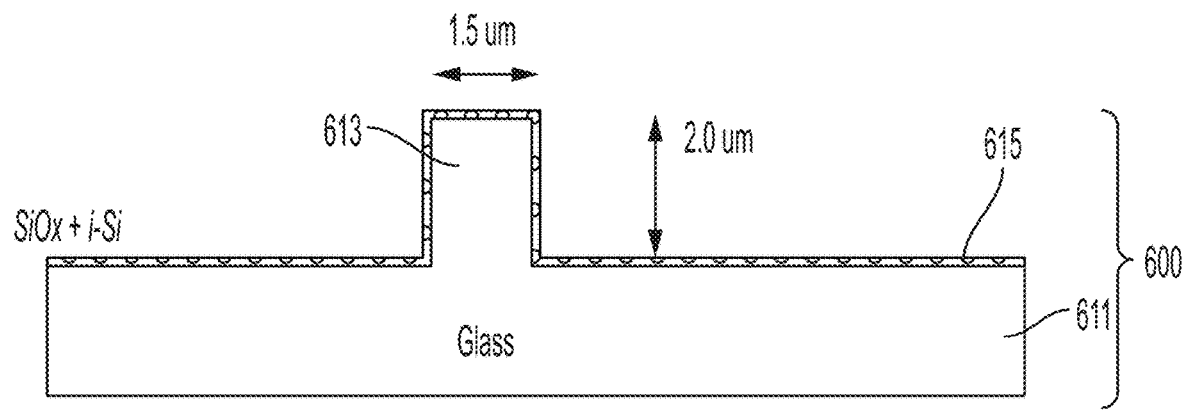

In one embodiment, the invention involves making porous membrane 601 using a pillar template 600 as shown in FIG. 6D. The process involves depositing hard mask layer 612 (e.g. 700-1400 angstroms ITO) over a glass substrate 611. Other hardmask materials may be used, such as a-Si. In addition, where a photoresist can survive the dry etch of the glass substrate described below, the hardmask may be optional. Photoresist is deposited and patterned to define pillars having a diameter of 3.5-8.5 microns as shown in FIG. 6A. If a hard mask layer 612 is used, the material is wet etched (0.25-0.75 micron side undercut) through the patterned photoresist to produce patterned hardmask 612' (2.0 to 8.0 micron diameter) as shown in FIG. 6B.

The glass substrate 611 is then dry etched to a depth of approximately 2 microns using a highly anisotropic etch. In the case where pillars 611' are desired to have a diameter of less than 2 microns, the previous anisotropic etch step is conducted to remove 1.6 microns instead of 2.0 microns. Then, a highly isotropic etch is performed to remove the last 0.4 microns as shown in FIG. 6C. After the glass etching is completed, the hardmask layer 612 is used with wet etch. The pillar template is completed using a blanket deposition of protection layer 615, which is preferably a thin bi-layer of 500 angstroms SiOx on the patterned glass substrate followed by 1000 angstroms i-Si. The i-Si protects the glass pillars from BOE etching, where the hardmask and release layer are removed. The pillar template 600 shown in FIG. 6D can be re-used many times.

Figure 6E:
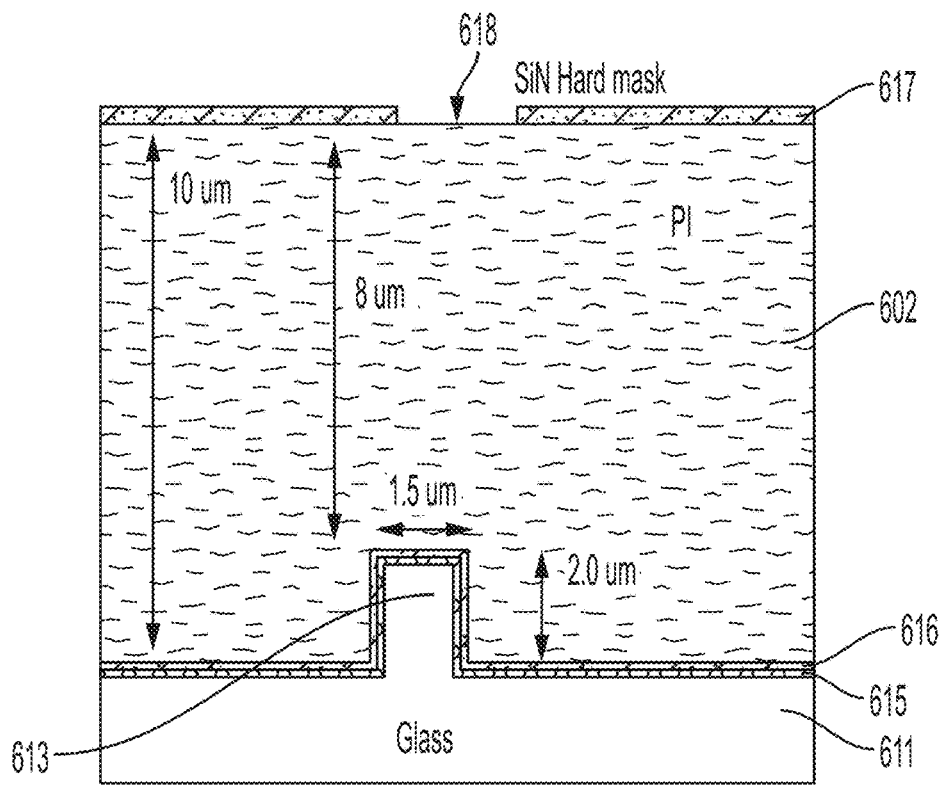

In one embodiment, the invention involves a process of making a porous membrane 601 using a pillar template as shown in FIGS. 6E-5F. The pillar template 600 comprises a plurality of pillars 613' that define pores of the membrane material and a protection layer 616 deposited over the pillars 613' and the protection layer 615 as shown in FIG. 6E. An optional release layer 616 (e.g., 500 angstroms SiN) is deposited over the protection layer 615. Next a polymer 602 (e.g., 10 microns of polyimide) is deposited over the optional release layer 616 on the pillar template 600.

Figure 6F:
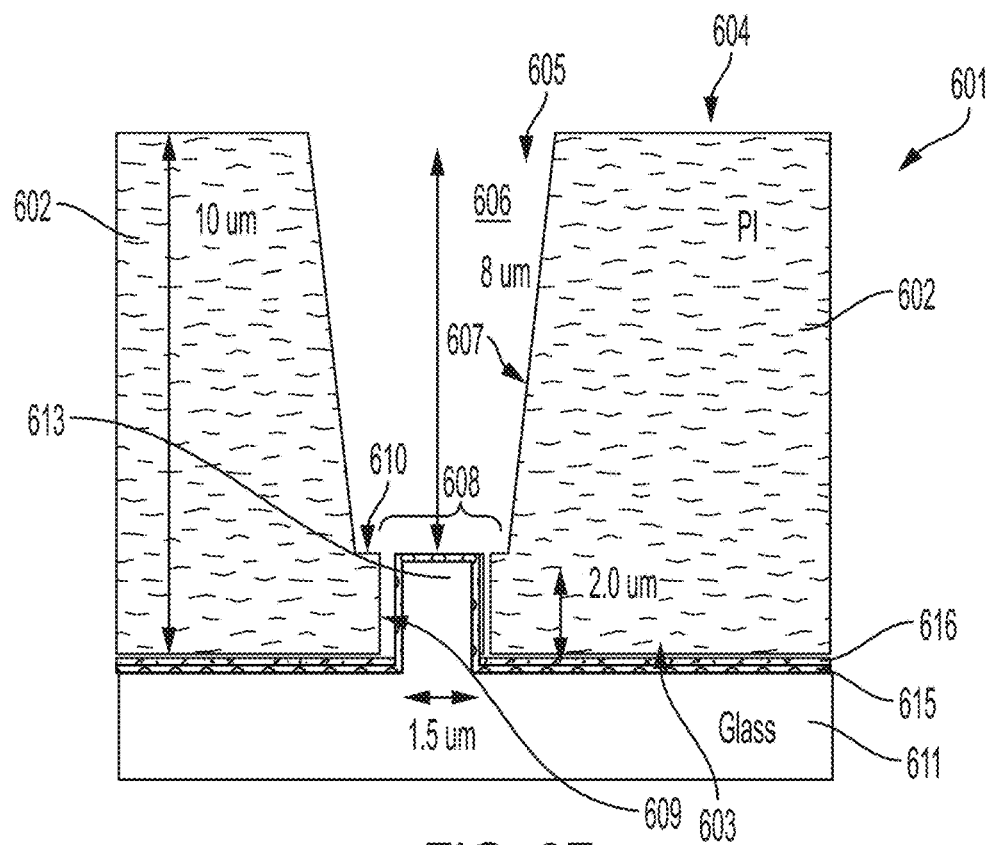

A hard mask layer 617 (e.g., 3000 angstroms silicon nitride) is deposited over the polymer layer 602 as shown in FIG. 6E. Photoresist (not shown) is deposited over the hardmask layer 617 and patterned, and the hardmask layer 617 is etched through the patterned photoresist to provide opening 618. The photoresist (not shown) is then stripped. The polymer layer 602 is etched (approximately 8 microns deep) through the patterned hardmask layer 617 until the release layer 616 in the region over the pillars 613' is exposed through the opening 606 as shown in FIG. 6F. In the case of no release layer 616, the polymer layer 602 is etched until the top of the pillars 613 is exposed through the opening 606.

The hardmask layer 617 is then removed using wet etching. If the release layer 616 is made from SiN, the step of removing the hardmask layer 617 will also remove the release layer. Otherwise, in the case the release layer is another material such as ITO, it is at least partially removed using wet etching. The structure with at least partially removed release layer 616 is shown in FIG. 6F. It may be desirable to adjust the amount of wet over-etch to release from pillar but not completely delaminate during etch, so that the membrane can be removed in a controllable way during a subsequent delamination step. The porous membrane 601 is thereafter released from the pillar template 600. The pillar template can then be reused to make another porous membrane.

The porous membrane 601 according to this embodiment includes a polymer layer 602 having a bottom surface 603 and top surface 604. The plurality of pores 605 extend through the polymer layer 602. Each pore has a first region 606 with a tapered profile 607 that opens wider at the intersection of the top surface of the membrane 604, and a second region 608 with a substantially vertical profile 609 that intersects the bottom surface of the membrane 603. As shown in FIG. 6F, the tapered profile 607 may be a conical profile. The first region 606 intersects the second region 608 at an intermediate surface 610 exposed through the opening created by the first region 606. The intermediate surface 610 provides a buffer that allows for non-uniformity in the etching and formation of the first region among different pores in the same membrane, and between separate manufacturing runs of different membranes.

Other embodiments and uses of the invention will be apparent to those skilled in the art from consideration of the specification and practice of the invention disclosed herein. All references cited herein, including all U.S. and foreign patents and patent applications, are specifically and entirely hereby incorporated herein by reference. It is intended that the specification and examples be considered exemplary only, with the true scope and spirit of the invention indicated by the following claims.

What is claimed is:

1. A process of making a porous membrane, the process comprising:
   (a) depositing a polymer layer on a pillar template, the pillar template comprising a plurality of pillars on a glass substrate that define pores of the membrane material and an optional release layer;
   (b) depositing hard mask layer over the polymer layer;
   (c) patterning the hard mask layer to define a plurality of openings in the hard mask layer that are aligned with each pillar corresponding to each pore;
   (d) removing the polymer layer until the optional release layer over each pillar or the pillar in the case of no release layer corresponding to each pore is exposed through a first opening in the polymer layer;
   (e) if the optional release layer is used, at least partially removing the release layer; and
   (f) releasing the porous membrane from the pillar template.

2. The process of claim 1, wherein after step (f) a second optional release layer is deposited on the pillar template and the steps (a)-(f) are repeated to form a second porous membrane.

3. The process of claim 1, wherein the hardmask layer and the release layer are made from the same material, and are both at least partially removed during step (e).

4. The process of claim 1, wherein the porous membrane in step (f) further comprises a bottom surface of the membrane and a top surface of the membrane; and a plurality of pores extending through the polymer layer, each pore having a first region with a tapered profile that opens wider at the intersection of the top surface of the membrane which is formed in step (e), and a second region with a substantially vertical profile that intersects the bottom surface of the membrane which is formed in step (f), the first region intersecting the second region at an intermediate surface facing exposed through the opening created by the first region.

5. The process of claim 4, wherein the substantially vertical profile has an angle in the range of 80° to 100° from the horizontal.

6. The process of claim 4, wherein the substantially vertical profile has an angle in the range of 85° to 95° from the horizontal.

7. The process of claim 4, wherein the intermediate surface of each pore has a surface area that varies among the pores to a greater degree than the surface are of the opening defined by the second region.

8. The process of claim 4, wherein the first region has a conical profile.

9. The process of claim 1, wherein the membrane layer comprises at least a material selected from at least one of polyimide, polyamide, polycarbonate, polyetherimide, polyether ketone, polyurethane, synthetic polymers, low-density polyethylene (LDPE), high-density polyethylene (HDPE), polypropylene (PP), polyvinyl chloride (PVC), polystyrene (PS), nylon, Teflon (polytetrafluoroethylene), thermoplastic polyurethanes (TPU), polyethylene, acrylate polymers, acrylate monomers, and/or acrylate elastomers.

\* \* \* \* \*